United States Patent [19]

Appels et al.

[11] 3,755,014

[45] Aug. 28, 1973

[54] METHOD OF MANUFACTURING A SEMICONDUCTOR DEVICE EMPLOYING SELECTIVE DOPING AND SELECTIVE OXIDATION

[75] Inventors: Johannes Arnoldus Appels; Maria Magdalena Mathilda Paffen; Else Kooi; Peter Johannes Philippus Gerardus Simons, all of Emmasingel, Eindhoven, Netherlands

[73] Assignee: U.S. Philips Corporation, New York, N.Y.

[22] Filed: July 8, 1971

[21] Appl. No.: 160,652

[30] Foreign Application Priority Data

July 10, 1970 Netherlands ........................ 7010207

[52] U.S. Cl. .................. 148/187, 148/175, 148/1.5, 317/235 R, 29/572, 148/188, 148/189

[51] Int. Cl. ............................ H01l 7/44, H01l 7/54

[58] Field of Search .................... 148/187, 172, 175; 317/235; 29/572

[56] References Cited

UNITED STATES PATENTS 3,386,865 6/1968 Doo .................................. 148/175

3,544,858 12/1970 Kooi ............................... 317/235 B

FOREIGN PATENTS OR APPLICATIONS 826,343 10/1969 Canada .............................. 148/187

OTHER PUBLICATIONS

Philips Res. Repts, 25, 118–132 (April 1970).

*Primary Examiner*—G. T. Ozaki

*Attorney*—Frank R. Trifari

[57] ABSTRACT

A method of manufacturing a semiconductor device having an inset oxide pattern and a doped zone which is present below said pattern and does not adjoin the surface. According to the invention, only one thin layer is used which masks both against doping and against oxidation. Via a first window the zone is first provided in said layer after which the window is enlarged and the pattern is formed by an oxidation treatment within the enlarged window, during which oxidation the zone is driven inwards.

8 Claims, 13 Drawing Figures

Figure 1:
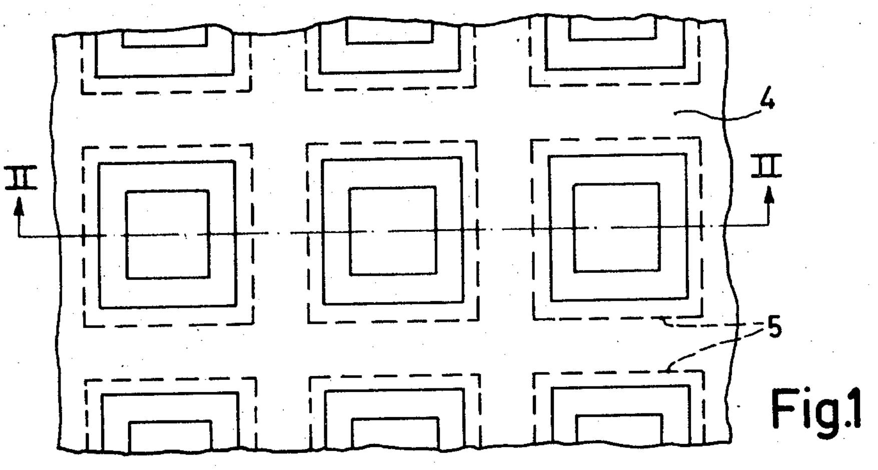

METHOD OF MANUFACTURING A SEMICONDUCTOR DEVICE EMPLOYING SELECTIVE DOPING AND SELECTIVE OXIDATION

The invention relates to a method of manufacturing a semiconductor device having a semiconductor body which is locally or selectively provided at a surface with an oxide pattern which is at least partly inset in the body and which adjoins a zone which, at least at its interface with the inset oxide, is fully surrounded by a semiconductor region which adjoins both the oxide and the zone and which has conductivity properties differing from those of the zone. The invention furthermore relates to a semiconductor device manufactured by using said method.

When several oxide layers are present an inset oxide pattern is to be understood to mean an oxide layer which is thicker and extends down to a larger depth in the semiconductor body than an adjoining oxide layer.

Semiconductor structures having an inset oxide pattern and a zone as described above are known and can advantageously be used particularly in integrated circuits, for example, for isolation purposes. In comparison with more conventional structures which have no inset oxide pattern, the inset oxide structures offer important advantages, in particular, higher breakdown voltages and lower capacities, and in many cases also considerable space saving in the wafer in which the integrated circuit is built. Also structures which comprises juxtaposed insulating layers of very different thickness but with a common substantially plane surface can be obtained. However, the manufacture of such structures often is difficult and cumbersome and usually requires the application of extra masking layers and often also the use of extra epitaxial layers and/or diffusion steps. As a result of this, the application of said favourable structures in practice often meets with serious drawbacks.

One of the objects of the present invention is to provide a simple and practical method by means of which the said structure can be realized while using a minimum number of operation steps.

For that purpose the invention is inter alia based on the recognition of the fact that a device having the desired structure can be obtained while using one single masking layer which masks both against doping and against oxidation and in which it is necessary only to enlarge the used window in the masking layer between said processes.

Therefore a method of the type mentioned in the preamble according to the invention is characterized in that a layer which masks both against doping and against oxidation and has at least an aperture which is permeable to activators is provided on the said surface, that the underlying semiconductor region is doped with activators through said aperture, that at least a part of the surface which is not doped by the said activators and substantially entirely surrounds the doped part is then exposed by removing a part of the masking layer, after which the unmasked part of the surface is oxidised during which oxidation the oxide pattern is formed, the activators further diffusing in the body and forming the said aforementioned zone.

Activators are to be understood to mean in this application in addition to donors and acceptors also materials which determine other electric properties of the semiconductor material, for example, the lifetime of minority charge carriers.

An aperture which is permeable to activators is to be understood to mean herein not only an aperture within which the semiconductor surface is fully uncovered, but also an aperture within which the semiconductor surface is fully or partly covered by a layer which is permeable to the said activators, in contrast with the masking layer. The aperture need not necessarily have a fully closed edge but may also consist, for example, of a gap the ends of which are not bounded by the masking layer.

According to the invention, the undoped surface part preferably entirely surrounds the doped part, although in circumstances this cannot be the case along a very small part of the circumference, for example, at the end of a gap-shaped aperture as described above.

By using the method according to the invention, the desired structure is obtained in a simple manner with the use of only one single masking layer, in which said masking layer preferably consists at least partly of a material differing from, and is considerably thinner than, the inset oxide pattern to be provided. As a result of this a great accuracy in masking and etching can be achieved with conventionally used photoresist methods.

The importance of the present invention in particular is in the fact that a method is indicated by which a doped region is caused to be inset in a semiconductor body in a simple manner and to be insulated from the surface by means of an insulating layer, the surface, if desired, remaining substantially flat. In particular when doping with donor atoms, the effect that during an oxidation treatment a diffused zone is driven deeper in the body ahead of the oxide, if required even deeper than the original depth of penetration of the diffused activators, is advantageously used in many cases.

In accordance with the specific manner in which the method according to the invention is carried out, many important structures suitable for a variety of applications can be obtained. According to a first important preferred embodiment the said semiconductor zone adjoining the inset oxide is doped with activators as a result of which said zone obtains a conductivity type which is opposite to the conductivity type of the semiconductor region adjoining the inset oxide and surrounding the zone. As a result of this a structure is obtained which inter alia is particularly suitable for isolation purposes in integrated circuits in which, for example, the said doped semiconductor zone adjoins a substrate of the same conductivity type, analogous to the normal isolation diffusion.

According to another preferred embodiment the semiconductor zone is doped with activators as a result of which said zone obtains the same conductivity type as but a higher doping concentration than the semiconductor region adjoining the inset oxide and surrounding the zone. The resulting structure can inter alia advantageously be used for interrupting inversion channels which might form below the inset oxide. The doping of the doped zone will be chosen to be so high that the formation of an inversion channel in said zone is impeded or cannot occur.

During the oxidation an increase in volume occurs, the volume of the formed oxide being larger than that of the oxidized semiconductor material. As a result of this, the oxide pattern will project above the semiconductor surface. This causes unevenesses in the surface which may be annoying notably for providing a metallisation. Therefore, in a further important preferred embodiment according to the invention, at least a part of the semiconductor surface to be oxidised is subjected, prior to the oxidation treatment in which the oxide pattern is obtained, to a treatment in which material is removed as a result of which a recess is formed in the surface after which the resulting recess is filled at least partly, and preferably substantially entirely, by the subsequent local oxidation. In this latter case a substantially plane surface of the body is obtained. The material-removing treatment may be an etching treatment but may also be an oxidation succeeded by the removal of the oxide, which treatment can be repeated, if necessary, to obtain a recess having the desired dimensions.

The material-removing treatment may take place either before the masking layer is provided or after the doping and the exposure of the surface part to be oxidised. In this latter case, of course, a material-removing treatment should be chosen which does substantially not attack the masking layer and said treatment should be discontinued when a depth is reached which is smaller than the depth of the region already doped with activators.

In order to obtain structures for isolating islands in integrated circuits, a ring-shaped part of the surface is exposed advantageously after the doping, after which an inset oxide pattern is provided by oxidation, which pattern fully surrounds an island-shaped part of the surface masked against said oxidation treatment, at least a semiconductor circuit element being provided on or in the semiconductor region adjoining said island-shaped surface part. A ring-shaped part is to be understood to mean herein generally a part in the form of a strip closed in itself which, however, need by no means be circular. The resulting ring-shaped oxide pattern may be single but, when used in integrated circuits, it preferably forms part of a grating or grid which surrounds at least two island-shaped surface parts masked against the said oxidation treatment. For the formation of islands which are isolated from the remaining part of the semiconductor body, the starting material in these preferred embodiments advantageously is a semiconductor body comprising a layer of a first conductivity type which adjoins the surface and which is present at least locally on a region of the second conductivity type, the oxide pattern being inset in the layer over at least a part of the thickness of said layer, a zone of the second conductivity type which adjoins the inset oxide being formed by doping with activators of the second conductivity type and adjoining the said region of the said conductivity type and forming a cohering region therewith, which region, together with the inset oxide, fully bounds an island-shaped region of the layer. The region of the second conductivity type may be a substrate region on which the layer of the first conductivity type is provided. In circumstances it may be of advantage for the oxide pattern to be inset throughout the thickness of the layer so that the doped zone of the second conductivity type penetrates into the substrate region and may serve, for example, for counteracting the formation of an inversion channel at the interface between the oxide pattern and the substrate region. This forms the subject matter of copending patent application, Ser. No. 160,651 filed simultaneously with this application. The region of the second conductivity type may also be a buried layer of the second conductivity type which is present between a substrate and an epitaxial layer of the same (first) conductivity type.

The invention furthermore comprises a semiconductor device manufactured by using the method according to one of the above-described variations.

Figure 2:
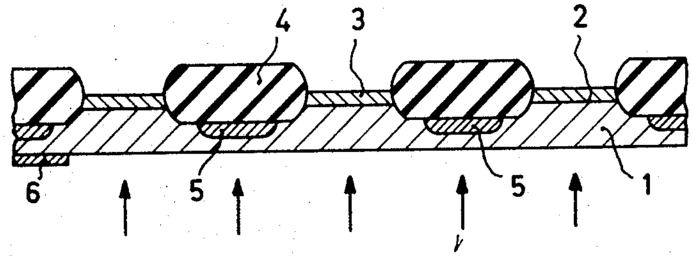
Figure 5:
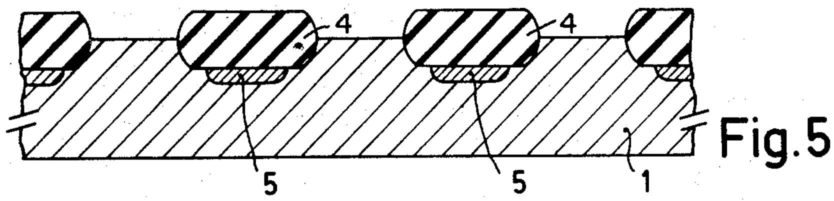
Figure 6:
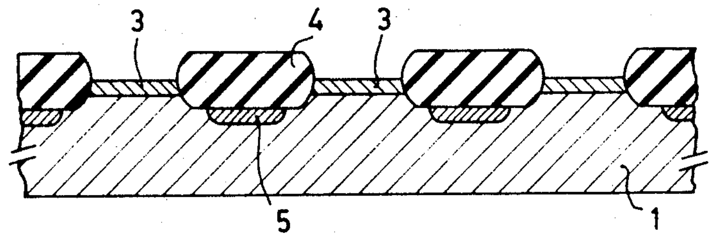
Figure 7:
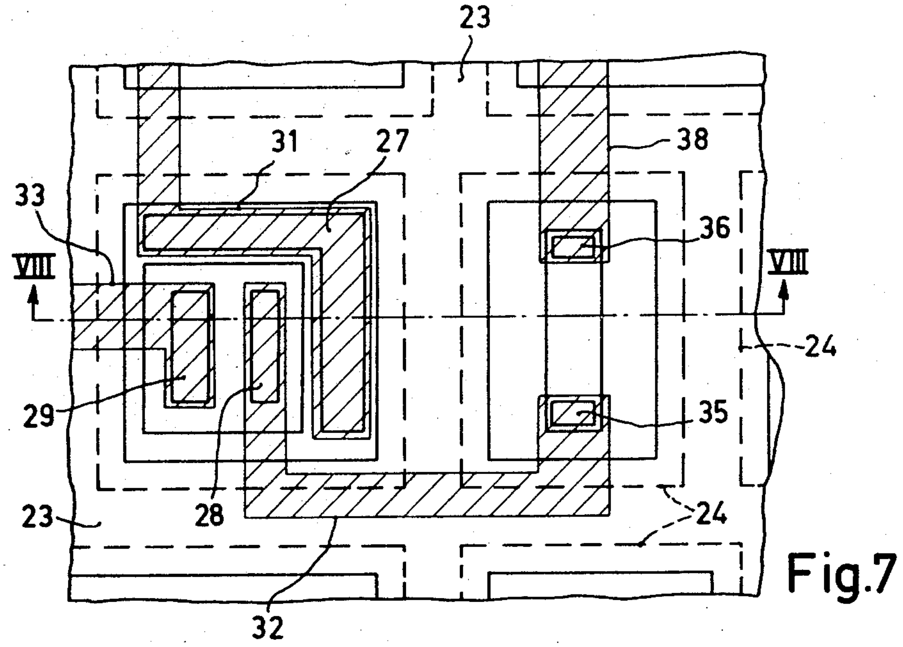
Figure 8:
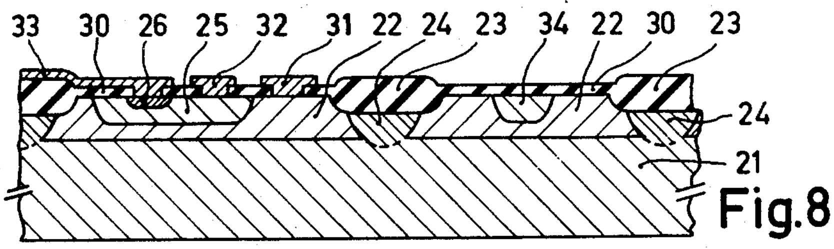
Figure 9:
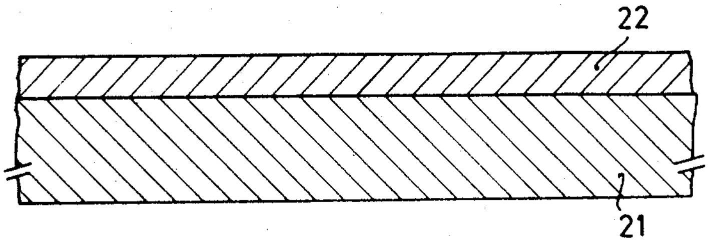
Figure 10:
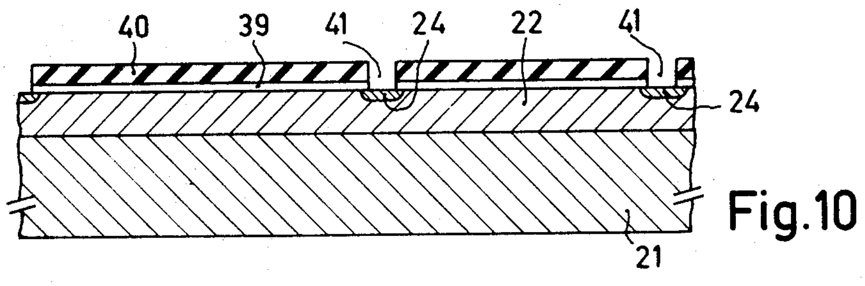
Figure 13:
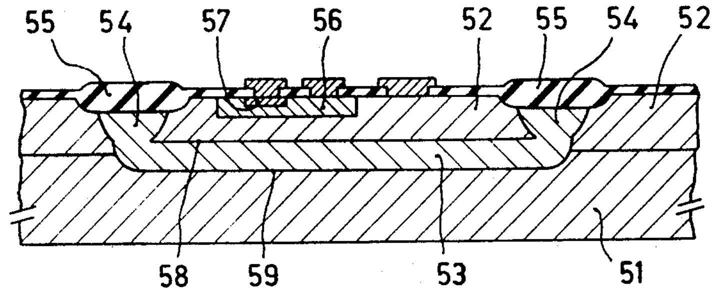

In order that the invention now be readily carried into effect, a few embodiments will not be described in greater detail, by way of example, with reference to the accompanying drawings, in which FIG. 1 is a diagrammatic plan view view of a device manufactured by using the method according to the invention, FIG. 2 is a diagrammatic cross-sectional view of the device as shown in FIG. 1 taken on the line II—II of FIG. 1, FIGS. 3 to 6 are diagrammatic cross-sectional views of the device shown in FIGS. 1 and 2 in successive stages of manufacture, FIG. 7 is a diagrammatic plan view of another device manufactured by using the method according to the invention, FIG. 8 is a diagrammatic cross-sectional view taken on the line VIII—VIII of the device shown in FIG. 7, FIGS. 9 to 12 are diagrammatic cross-sectional views of the device shown in FIGS. 7 and 8 in successive stages of manufacture and FIG. 13 is a diagrammatic cross-sectional view of a third device manufactured by using the method according to the invention.

The figures are diagrammatic and not drawn to scale in which, for clarity, the dimensions notably in the direction of the thickness are exaggerated. Corresponding components are as a rule referred to by the same reference numerals.

FIG. 1 is a plan view and FIG. 2 is a diagrammatic cross-sectional view taken on the line II—II of FIG. 1 of a target plate for converting electromagnetic radiation into electric signals to be used, for example, in camera tubes for television cameras. This target plate consists of a plate 1 of n-type silicon having a resistivity of 8 ohm.cm which is provided on one side with radiation-sensitive mesa diode structures having p-n junctions 2 which are present between the plate 1 and a p-type layer 3 diffused in said plate. The diodes are separated by a grating-shaped pattern 4 of silicon oxide which is partly inset in the silicon plate. This inset oxide 4 is partly bounded by an n-type zone 5 having a higher doping than the region 1 surrounding the zone. As a result of this the possibility that the depletion layers of adjacent diodes should touch each other is considerably restricted and the formation of an inversion layer, as a result of which an undesirable electric connection between adjacent diodes might occur, is also counteracted. Furthermore, due to the difference in doping concentration between the zone 5 and the region 1 a drift field is inherently formed as a result of which charge carriers generated locally under the influence of incident radiation are prevented from moving to a diode other than the nearest. The n-type zone 5 does not adjoin the p-type layer 3 but is separated therefrom by the n-type region 1 so that reduction of the breakdown voltage of the diodes is avoided as much as possible and the diode capacity remains comparatively small.

The device which in itself is a new, particularly interesting embodiment of a target plate can be assembled in normal manner in a vidicon camera tube. In this device, for example, the radiation is incident on the side of the plate remote from the layer 3 in the direction of the arrows shown in FIG. 2, while on the side of the layer 3 the plate is scanned by an electron beam in which a part of the surface on which the radiation is incident comprises a connection contact 6 (diagrammatically shown in FIG. 2) which preferably extends along the whole edge of the plate. For further details regarding the arrangement and operation of such a target plate, reference is made to, for example, the article "Bell System Technical Journal," Vol. 48, 1969, pp. 1481–1528.

According to the invention, the device described can simply be manufactured as follows, see FIGS. 3 to 6.

The starting material is a monocyrstalline n-type silicon plate oriented according to the (111) direction and having a resistivity of 8 ohm.cm, a diameter of 25 mm and a thickness of 250 microns. A surface 7 of said plate is polished flat. A layer 8 of silicon nitride, 0.15 microns thick, is then provided on said surface by heating in an atmosphere containing $SiH_4$ and $NH_3$ at a temperature of 1000° C. A layer 9 of silicon oxide, 0.2 micron thick, is provided on said layer 8 by heating in an atmosphere containing $SiH_4CO_2$ and $H_2$. For all the details of the methods to be used for providing the silicon nitride and silicon oxide layers mentioned in this example and in the following examples, as well as for etching of said layers, reference is made to "Philips Research Reports," April, 1970, pp. 118–132, Canadian Patent 826,343 and U.S. Pat. 3,544,858, in which publications all the information necessary for those skilled in the art is given.

Figure 3:
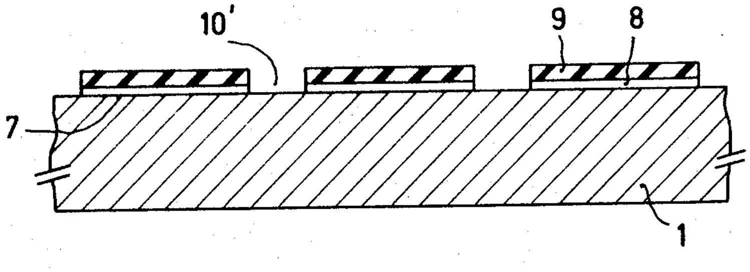

While using photoresist methods generally used in semiconductor technology, apertures in the form of grooves 10, 5 microns wide, are then etched in said double layer of silicon nitride and silicon oxide. As a result of this the structure shown in FIG. 3 is obtained.

Figure 4:
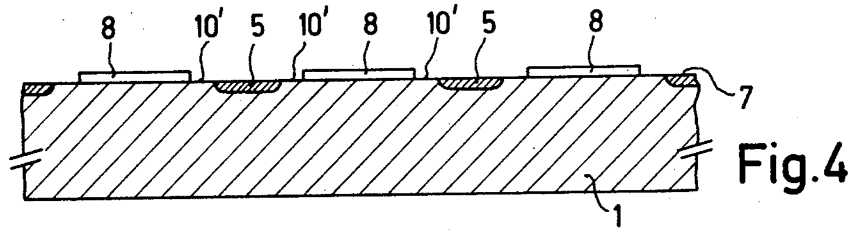

Phosphorus is then diffused in said apertures 10, the nitride oxide layer (8, 9) serving as a diffusion mask. As a result of this, n-type zones 5 are formed (see FIG. 4) having a surface concentration of $10^{20}$ donor atoms/ccm. The oxide layer is then removed with a buffered $NH_4F$-solution after which the nitride layer 8 is partly removed by means of a photo-resist method and while using phosphoric acid as an etchant, a part 10' of the surface 7 which was not doped with phorphorus atoms and which fully surrounds the doped part of the surface 7 occupied by the zone 5 being exposed so that the structure shown in FIG. 4 is obtained.

The plate is then oxidized at 1000° C in water vapour saturated at 95°C for 16 hours. The parts covered by the silicon nitride layer are not oxidized while the nitride layer 8 itself is oxidized only superficially. During this oxidation treatment an oxide pattern 4 is formed locally in the silicon not covered by the nitride layer 8, which pattern penetrates into the silicon by approximately 1 micron and projects above it by approximately 1 micron. The zone 5 is also moved and its thickness slightly increases by further diffusion. After removing the nitride layer 8 in phosphoric acid at 180° C, the structure shown in FIG. 5 is obtained.

Boron is then diffused in the resulting plate, a p-type surface layer 3, 0.5 micron thick, having a surface concentration of approximately $10^{19}$ acceptor atoms per ccm being formed in the silicon not covered by the oxide pattern 4, see FIG. 6. The silicon plate is then etched thin to an overall thickness of approximately 30 microns by etching down the surface present opposite to the oxide pattern 4, after which the resulting target plate is provided, if desirable, on the side of the diodes, with further layers to improve the operation of the target plate (for this purpose see, for example, the already above-cited article in "Bell System Technical Journal"). The plate is provided in normal manner with a contact 6 and assembled in a camera tube.

The manufacture described can be varied in many manners. Notably the doping can be carried out by ion implantation instead of by diffusion while, for example, the diodes 3 can also be constructed as planar diodes by selective diffusion. Furthermore, by carrying out a local etching treatment at the area of the oxide pattern to be formed prior to the oxidation treatment, an oxide pattern can be obtained the upper surface of which substantially coincides with the silicon surface or lies even below it.

FIG. 7 is a plan view and FIG. 8 a cross-sectional view taken on the line VIII—VIII of FIG. 7 of a part of an integrated circuit manufactured by using the method according to the invention. The part shown in the figures comprises a p-type substrate 21 of silicon having a resistivity of 5 ohm.cm and a thickness of 250 microns on which a layer of n-type silicon 22 having a resistivity of 1 ohm.cm. and a thickness of 4 microns is grown epitaxially. The layer 22 is divided into islands by a grating-shaped pattern of silicon oxide 23 which is partly inset in the layer 22 and adjoins a p-type zone 24 which, at its interface with the inset oxide 23, is fully surrounded by the layer 22 and adjoins the substrate 21. This island-isolation forms the subject matter of the copending patent application Ser. No. 160,650 filed simultaneously with this application. A transistor having a p-type base zone 25 and an n-type emitter zone 26 is provided in one of the islands, of which transistor the layer 22 forms the collector. The zones 22, 25 and 26 are connected to metal layers 31, 32 and 33 via windows 27, 28 and 29 in an oxide layer 30 provided on the surface. A resistor consisting of a p-type zone 34 which is connected, via windows 35 and 36 in the oxide layer 30, to the metal layer 32 which is also connected to the base zone 25 of the transistor and to the metal layer 38, is provided in another island. The metal layers are shaded in FIG. 7.

The device described was manufactured according to the invention in the following manner (see FIGS. 9 to 12). Starting material is a silicon plate (see FIG. 9) consisting of a p-type substrate 21 having an n-type expitaxial layer 22 of the above-mentioned dimensions and conductivity properties. On this layer (see FIG. 10), a layer 39 of silicon nitride, 0.15 micron thick, is provided which is covered by a layer 40 of silicon oxide, 0.2 micron thick, all this in the same manner as described in the preceding example. Grooves 41, 5 microns wide, are etched in said double layer and boron is indiffused via said grooves to form p-type zones 24 having a surface concentration of $5.10^{20}$ atoms/ccm and a depth of approximately 2 microns (see FIG. 10).

Figure 11:
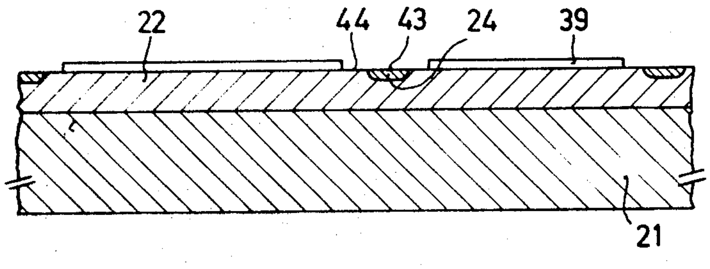
Figure 12:
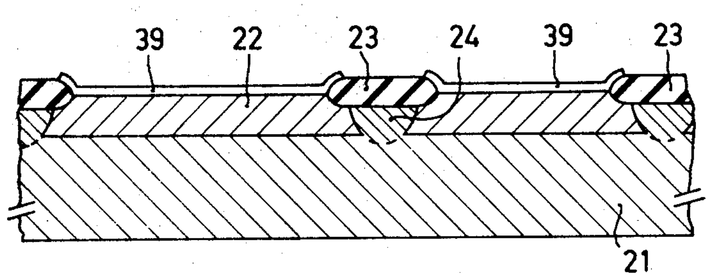

The oxide layer 40 is then removed with an $NH_4F$-buffer solution after which the grooves 41 in the nitride layer 39 are widened so that in addition to the surface part 43 occupied by the zone 24 a surface part 44 not doped with boron and surrounding the part 43 fully is exposed, see FIG. 11. By oxidation at 1,000° C in water vapour saturated at 95° C for 16 hours the silicon not covered by the nitride layer 39 is oxidized so that an oxide pattern 23, approximately 2 microns thick, is obtained (see FIG. 12) which is inset in the layer 22 over a thickness of approximately 1 micron. The p-type zone 24 is further driven into the silicon and its thickness increases slightly by diffusion, said zone adjoining the p-type substrate 21.

After removing the layer 39 in phosphoric acid and after providing a new oxide layer 30 on the surface, the zones 25, 26 and 34 and the metal layers are provided by using generally used masking and diffusion methods so that the structure shown in FIGS. 7 and 8 is obtained. This structure and the associated advantages are described in detail in the above-mentioned copending patent application Ser. No. 160,650 filed simultaneously with this application.

FIG. 13 is a cross-sectional view of a device obtained according to a variation of the above-described method. This device differs from the preceding example in that an epitaxial layer 52 of the same conductivity type as the substrate 51 is provided on the substrate 51, a buried layer 53 of the opposite conductivity type being present between the substrate and the epitaxial layer. Zones 54 of the same conductivity type as the layer 53 adjoin said buried layer 53, said zones 54 adjoining on the upper side an oxide pattern 55 partly inset in the silicon. With the layer 53 the zones 54 enclose an island-shaped region of the layer 52 which forms the collector zone of a transistor having a base zone 56 and an emitter zone 57. This island-shaped region is isolated from the remaining part of the semiconductor body by the p-n junctions 58 and 59 of which in the operating condition at least one is always blocked. This device also forms the subject matter of the already-mentioned copending patent application Ser. No. 160,650. It will be obvious that the device shown in FIG. 13 can be obtained in quite the same manner as in the preceding example by using the method according to the invention and that it has analogous advantages.

Of course the invention is not restricted to the embodiment described here by way of illustration. Among the many variations which are possible to those skilled in the art without departing from the scope of this invention are to be mentioned, inter alia, the use of other doping methods such as ion implantation or doping starting from a source consisting of a doped oxide layer on the semiconductor surface in combination with diffusion and/or ion implantation. Also, the use of other semiconductor materials which can form a useful oxide pattern, for example, silicon carbide is possible. Instead of silicon nitride or combined silicon nitride-silicon oxide layers, other layers masking against oxidation may also be used in circumstances. Furthermore it is not necessary for the semiconductor surface within the apertures 10 (FIG. 3) and 41 (FIG. 10), respectively, to be exposed entirely; dependent upon the way of doping and the activators used, the semiconductor surface within said apertures may also be covered with a layer which is permeable to said activators. In addition, after the layer masking against oxidation has been given its ultimate shape, the silicon surface not covered by said layer may be doped, if desirable, by diffusion or differently prior to providing the inset oxide pattern.

We claim:

1. A method of manufacturing a semiconductor device comprising providing on the surface of a semiconductor body a layer capable of masking the semiconductor against oxidation of its surface and also against the introduction of activators, forming in said masking layer at least a first aperture capable of passing activators into the semiconductor body while the masking layer remaining prevents said activators from reaching other parts of the body, introducing activators through the first aperture and into the body to form within the latter a surface zone doped by said introduced activators and having conductivity properties differing from adjacent body parts, thereafter removing part of the masking layer to enlarge the first aperture in said masking layer to form a second opening including the first aperture and in addition exposing at least an activator-undoped body surface portion which substantially entirely laterally surrounds the said doped surface zone, and thereafter subjecting the body with said masking layer in place to an oxidizing treatment causing oxide to grow at the unmasked body surface portion within the second opening until the grown oxide is inset at least partly in the body, the activators in said doped zone diffusing further into the body during the oxidation step, resulting in the activator-doped zone adjoining the inset oxide and being buried in the body and being laterally surrounded by semiconductor regions of different conductivity properties which also adjoin the inset oxide.

2. A method as claimed in claim 1 wherein the semiconductor zone is doped with activators producing in said zone a conductivity type which is opposite to the conductivity type of the semiconductor regions adjoining the inset oxide and surrounding the said zone.

3. A method as claimed in claim 1 wherein the semiconductor zone is doped with activators producing in said zone the same conductivity type as but a higher doping concentration than that of the semiconductor regions adjoining the inset oxide and surrounding the said zone.

4. A method as claimed in claim 1 wherein prior to the oxidizing treatment in which the inset oxide is obtained, at least a part of the semiconductor surface to be oxidized is subjected to a treatment for removing material as a result of which a recess is formed in the surface, after which the resulting recess is at least partly filled by the subsequent oxidizing step.

5. A method as claimed in claim 4 wherein the recess obtained by etching is substantially entirely filled to obtain a substantially flat surface of the body.

6. A method as claimed in claim 1 wherein the first aperture is ring-shaped and fully surrounds an island-shaped part of the body surface which is masked against said oxidizing treatment, and at least a semiconductor circuit element is provided at the semiconductor region adjoining said island-shaped surface part.

7. A method as claimed in claim 6 wherein the inset oxide is provided in the form of a grid pattern which surrounds at least two island-shaped surface parts masked against the said oxidizing treatment.

8. A method as claimed in claim 7 wherein the starting material is a semiconductor body comprising a layer of a first conductivity type which adjoins the surface and which is at least locally present on a region of a second opposite conductivity type, the oxide pattern being inset in the layer over at least a part of the thickness of said layer, said buried doped zone being of the second conductivity type and being formed by doping with activators of the second conductivity type and adjoining the region of the said second conductivity type and forming an integral region therewith, which integral region, together with the inset oxide, fully bounding island-shaped regions of the layer.

* * * * *